(12) United States Patent
Yeh et al.

(10) Patent No.: US 8,350,260 B2
(45) Date of Patent: Jan. 8, 2013

(54) TRANSISTOR STRUCTURE

(75) Inventors: Chia-Chun Yeh, Hsinchu (TW); Henry Wang, Hsinchu (TW); Yao-Chou Tsai, Taipei (TW); Sung-Hui Huang, Taipei County (TW)

(73) Assignee: E Ink Holdings Inc., Hsinchu (TW)

( * ) Notice: Subject to any disclaimer, the term of this patent is extended or adjusted under 35 U.S.C. 154(b) by 168 days.

(21) Appl. No.: 13/013,828

(22) Filed: Jan. 26, 2011

(65) Prior Publication Data
US 2012/0061650 A1    Mar. 15, 2012

(30) Foreign Application Priority Data
Sep. 14, 2010  (TW) ................................. 99131063 A

(51) Int. Cl.
*H01L 51/10* (2006.01)
(52) U.S. Cl. .................................. 257/40; 257/E51.011
(58) Field of Classification Search .................... 257/40, 257/E51.004, E51.011
See application file for complete search history.

(56) References Cited

U.S. PATENT DOCUMENTS

| | | | |
|---|---|---|---|
| 5,315,129 A * | 5/1994 | Forrest et al. | 257/21 |
| 2005/0275056 A1* | 12/2005 | Forrest | 257/479 |
| 2007/0075365 A1* | 4/2007 | Mardilovich et al. | 257/347 |
| 2009/0108749 A1* | 4/2009 | Yokoyama et al. | 313/504 |
| 2009/0256140 A1* | 10/2009 | Meng et al. | 257/40 |
| 2010/0213447 A1* | 8/2010 | Fujimoto et al. | 257/40 |
| 2012/0146011 A1* | 6/2012 | Nakayama et al. | 257/40 |

* cited by examiner

*Primary Examiner* — Thomas L Dickey
(74) *Attorney, Agent, or Firm* — CKC & Partners Co., Ltd.

(57) ABSTRACT

A transistor structure comprises a patterned N-type transparent oxide semiconductor formed over a substrate as a base, and a patterned p-type organic polymer semiconductor formed on the patterned N-type transparent oxide semiconductor comprising a first portion and a second portion so that the patterned N-type transparent oxide semiconductor and the first portion and the second portion of the patterned p-type organic polymer semiconductor form heterojunctions therebetween respectively, wherein the first portion of the patterned p-type organic polymer semiconductor is used as an emitter, and the second portion of the patterned p-type organic polymer semiconductor is used as a collector.

14 Claims, 5 Drawing Sheets

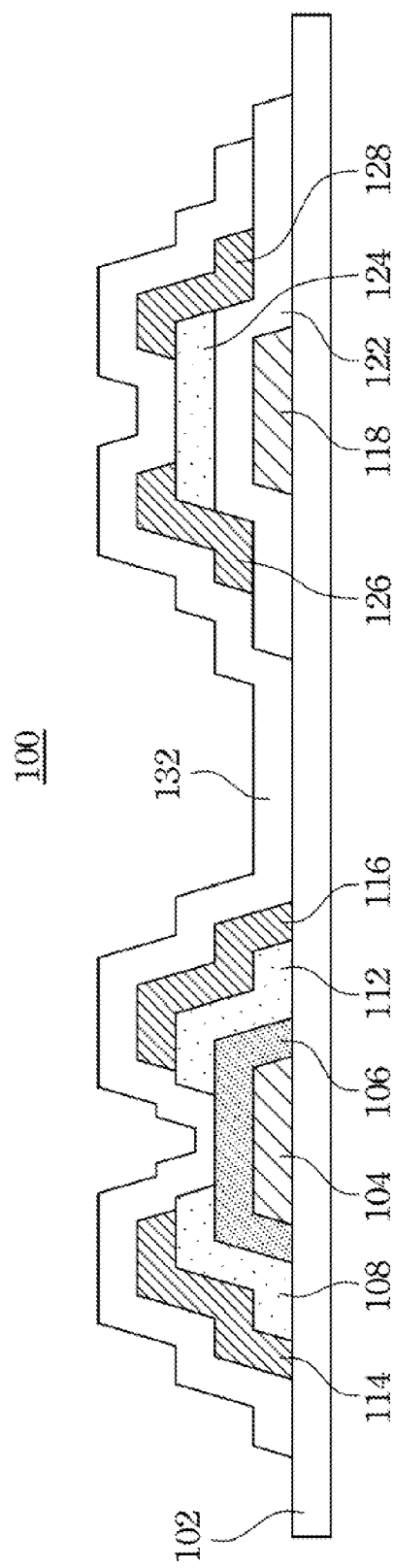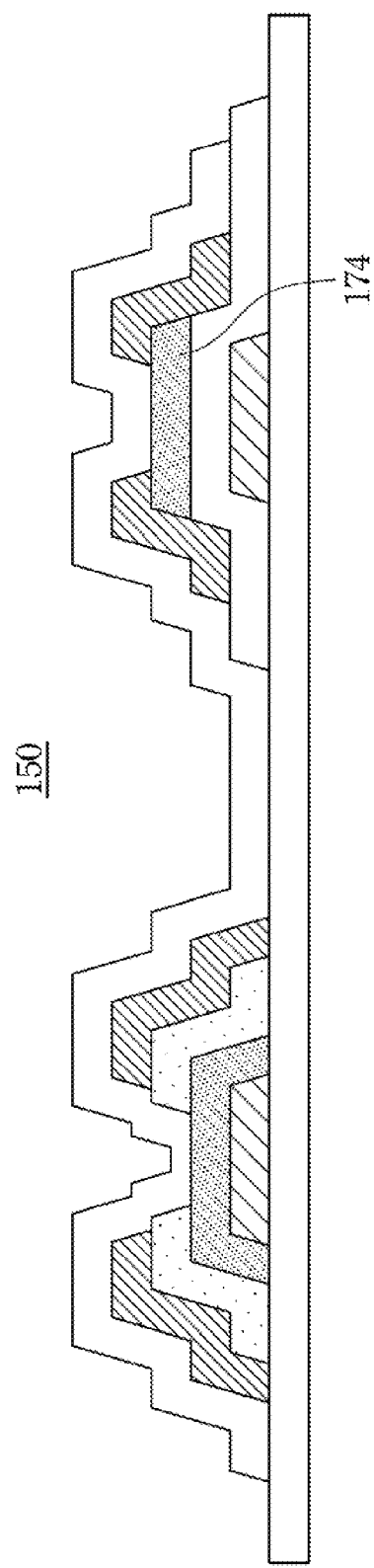

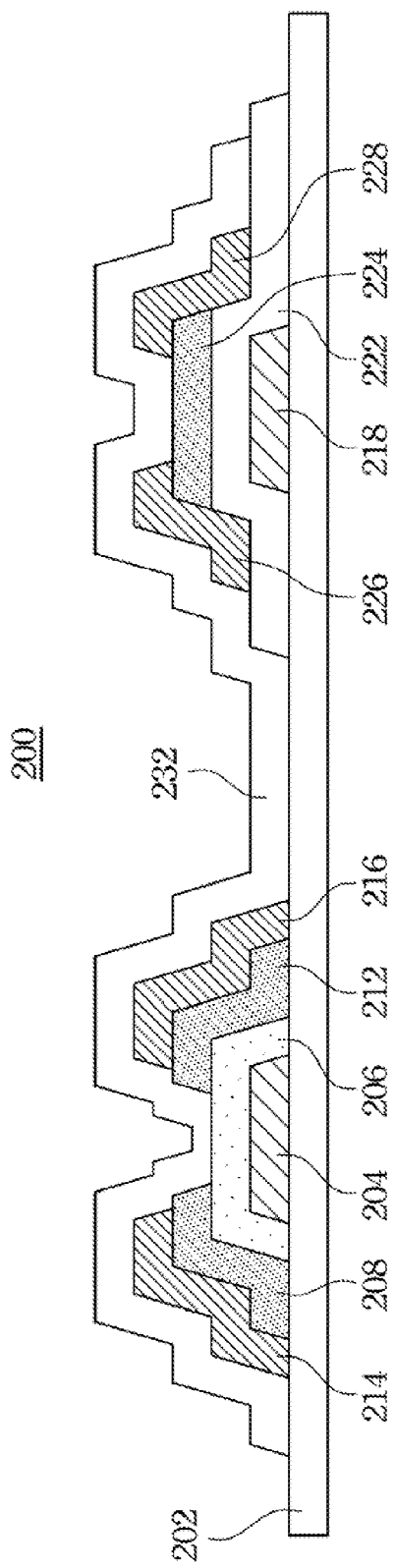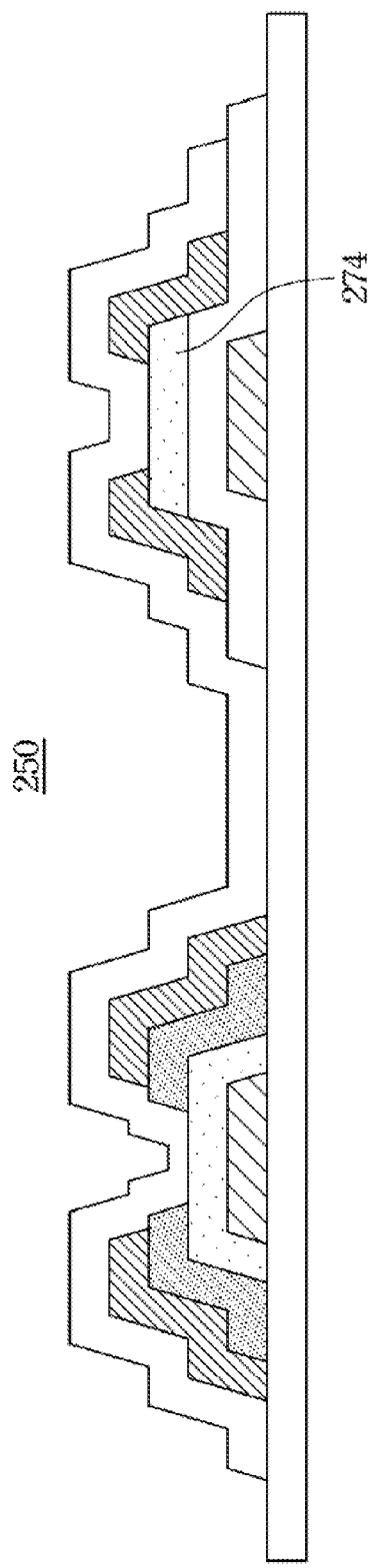

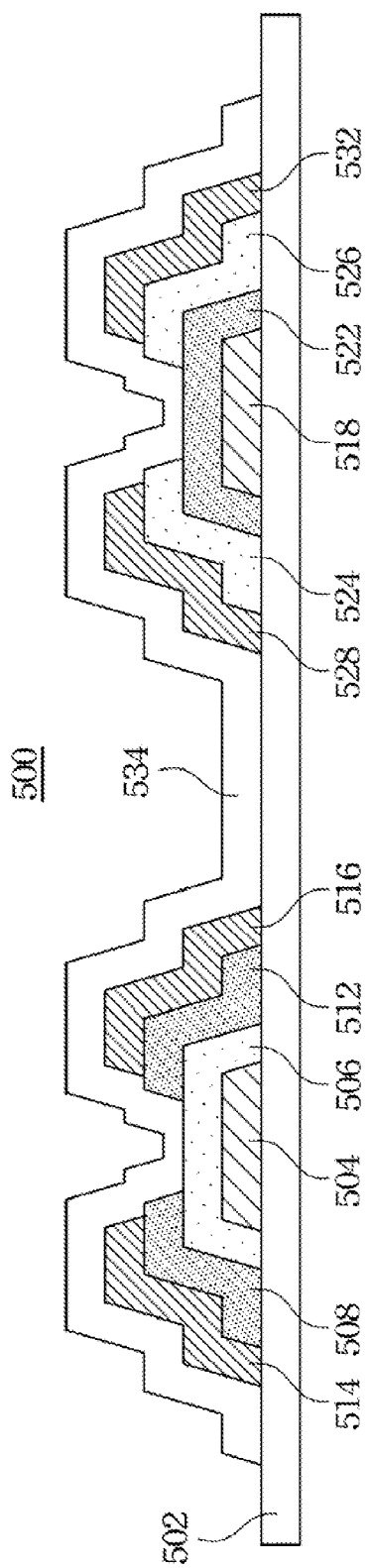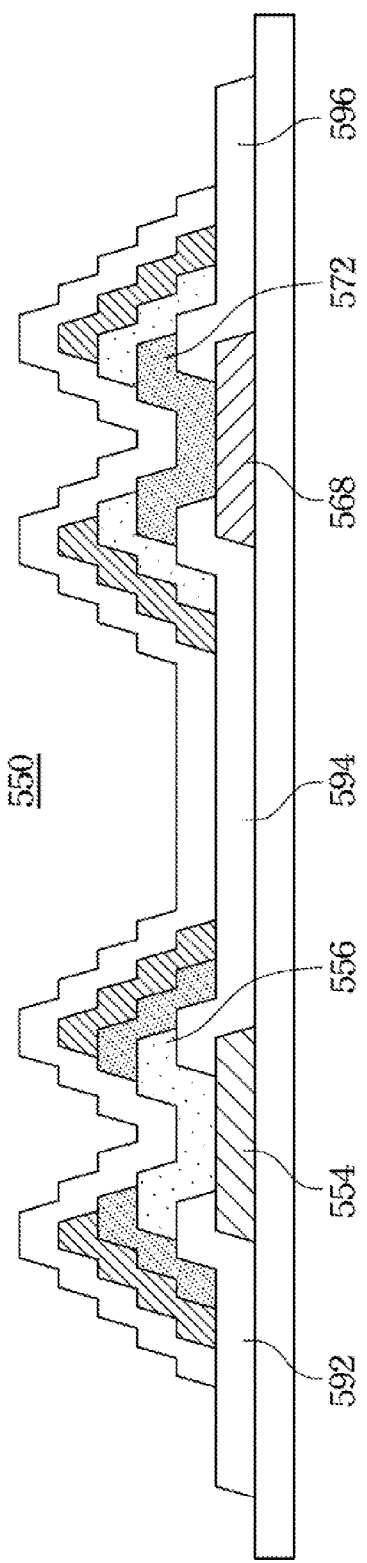

TRANSISTOR STRUCTURE

RELATED APPLICATIONS

This application claims priority to Taiwan Application Serial Number 099131063, filed Sep. 14, 2010, which is herein incorporated by reference.

BACKGROUND

1. Field of Invention

The embodiment of the present invention relates generally to a transistor structure and, more particularly, to a transistor structure with transparent oxide semiconductor and organic polymer semiconductor.

2. Description of Related Art

Due to the development of the technology and the demand of the display quality by consumers, the technology of the display is mature day by day. The next generation display technology has been developed during recent years so that the display element is thinner, transparent, and flexible in the next generation display technology, and the quality and the property of the display element are the main research objective for the display.

Conventionally, a-Si:H TFTs have been widely used in many applications. However, the process temperature of the a-Si:H TFTs is quite high thereby resulting in higher manufacturing cost. Besides, a-Si:H TFTs are opaque and have low carrier mobility. As such, it is not feasible to manufacture various feature elements on a single panel using the a-Si:H TFT process. In view of these problems, low temperature poly-silicon (LTPS) TFTs that have higher carrier mobility are developed. However, the process temperature of LTPS TFTs is even higher than that of the a-Si:H TFTs which further increase the manufacturing cost of LTPS TFTs.

In view of the foregoing, there exists a need in the related art to provide a novel material and process for manufacturing TFT elements with satisfactory carrier mobility at lower costs.

SUMMARY

A transistor structure using a transparent oxide semiconductor and organic polymer semiconductor is provided so as to solve the problem for using the a-Si:H TFT and Low Temperature Polycrystalline Silicon TFT (LTPS TFT) such as low carrier mobility, high manufacturing cost, and high process temperature.

Thus, one aspect of the embodiment of the present invention is to provide a transistor structure. The transistor structure comprises a patterned N-type transparent oxide semiconductor layer and a patterned P-type organic polymer, semiconductor layer. The patterned N-type transparent oxide semiconductor layer is formed on a substrate as a base. The patterned P-type organic polymer semiconductor layer is formed on the patterned N-type transparent oxide semiconductor layer, and the patterned P-type organic polymer semiconductor layer comprises a first portion and a second portion so that the patterned N-type transparent oxide semiconductor layer and the first portion and the second portion of the patterned P-type organic polymer semiconductor layer form a heterojunction therebetween respectively, wherein the first portion of the patterned P-type organic polymer semiconductor layer is used as an emitter, and the second portion of the patterned P-type organic polymer semiconductor layer is used as a collector.

In one embodiment of the present invention, the patterned N-type transparent oxide semiconductor layer comprises IGZO, and the patterned P-type organic polymer semiconductor layer comprises Pentacene.

In another embodiment of the present invention, the transistor structure further comprises an insulation layer. The insulation layer is formed between the substrate and the patterned N-type transparent oxide semiconductor layer.

In another aspect, the embodiment of the present invention provides a transistor structure, the transistor structure comprises a patterned P-type organic polymer semiconductor layer and a patterned N-type transparent oxide semiconductor layer. The patterned P-type organic polymer semiconductor layer is formed over a substrate as a base. The patterned N-type transparent oxide semiconductor layer is formed on the patterned P-type organic polymer semiconductor layer, and the patterned N-type transparent oxide semiconductor layer comprises a first portion and a second portion, so that the patterned P-type organic polymer semiconductor layer and the first portion and the second portion of the patterned N-type transparent oxide semiconductor layer form a heterojunction therebetween respectively, wherein the first portion of the patterned N-type transparent oxide semiconductor layer is used as an emitter, and the second portion of the patterned N-type transparent oxide semiconductor layer is used as a collector.

In one embodiment of the present invention, the patterned N-type transparent oxide semiconductor layer comprises IGZO, and the patterned P-type organic polymer semiconductor layer comprises Pentacene.

In another embodiment of the present invention, the transistor structure further comprises an insulation layer. The insulation layer is formed between a substrate and the patterned P-type organic polymer semiconductor layer.

In yet another aspect, the embodiment of the present invention provides a transistor structure. The transistor structure comprises a first patterned conductive layer, a patterned N-type transparent oxide semiconductor layer, a patterned P-type organic polymer semiconductor layer, a patterned gate insulation layer, an active layer and a second patterned conductive layer. The first patterned conductive layer is formed over a substrate. The first patterned conductive layer comprises a first portion and a second portion. The first portion of the first patterned conductive layer is used as a base conductive layer, and the second portion of the first patterned conductive layer is used as a gate. The patterned N-type transparent oxide semiconductor layer is formed on the first portion of the first patterned conductive layer. The patterned P-type organic polymer semiconductor layer is formed on the patterned N-type transparent oxide semiconductor layer, and the patterned P-type organic polymer semiconductor layer comprises a first portion and a second portion, so that the patterned N-type transparent oxide semiconductor layer and the first portion and the second portion of the patterned P-type organic polymer semiconductor layer form a heterojunction therebetween respectively, wherein the first portion of the patterned P-type organic polymer semiconductor layer is used as an emitter, and the second portion of the patterned P-type organic polymer semiconductor layer is used as a collector. The patterned gate insulation layer is formed on the second portion of the first patterned conductive layer. The active layer is formed on the patterned gate insulation layer so that the active layer is disposed over the second portion of the first patterned conductive layer. The second patterned conductive layer is formed on the active layer, and the second patterned conductive layer comprises a first portion and a second portion, wherein the first portion of the second patterned conductive layer is used as a source, and the second portion of the second patterned conductive layer is used as a drain.

In one embodiment of the present invention, the patterned N-type transparent oxide semiconductor layer comprises IGZO, and the patterned P-type organic polymer semiconductor layer comprises Pentacene.

In another embodiment of the present invention, the active layer is the patterned N-type transparent oxide semiconductor layer or the patterned P-type organic polymer semiconductor layer.

In yet another embodiment of the present invention, the transistor structure further comprises an insulation layer. The insulation layer is formed between the first portion of first patterned conductive layer and the patterned N-type transparent oxide semiconductor layer.

In still another aspect, the embodiment of the present invention provides a transistor structure. The transistor structure comprises a first patterned conductive layer, a patterned P-type organic polymer semiconductor layer, a patterned N-type transparent oxide semiconductor layer, a patterned gate insulation layer, an active layer, and a second patterned conductive layer. The first patterned conductive layer is formed over a substrate, and the first patterned conductive layer comprises a first portion and a second portion, wherein the first portion of the first patterned conductive layer is used as a base conductive layer, and the second portion of the first patterned conductive layer is used as a gate. The patterned P-type organic polymer semiconductor layer is formed on the first portion of the first patterned conductive layer. The patterned N-type transparent oxide semiconductor layer is formed on the patterned P-type organic polymer semiconductor layer, and the patterned N-type transparent oxide semiconductor layer comprises a first portion and a second portion, so that the patterned P-type organic polymer semiconductor layer and the first portion and the second portion of the patterned N-type transparent oxide semiconductor layer form a heterojunction therebetween respectively, wherein the first portion of the patterned N-type transparent oxide semiconductor layer is used as an emitter, and the second portion of the patterned N-type transparent oxide semiconductor layer is used as a collector. The patterned gate insulation layer is formed on the second portion of the first patterned conductive layer. The active layer is formed on the patterned gate insulation layer, so that the active layer is disposed over the second portion of the first patterned conductive layer. The second patterned conductive layer is formed on the active layer, and the second patterned conductive layer comprises a first portion and a second portion, wherein the first portion of the second patterned conductive layer is used as a source, and the second portion of the second patterned conductive layer is used as a drain.

In one embodiment of the present invention, the patterned N-type transparent oxide semiconductor layer comprises IGZO, and the patterned P-type organic polymer semiconductor layer comprises Pentacene.

In another embodiment of the present invention, the active layer is the patterned N-type transparent oxide semiconductor layer or the patterned P-type organic polymer semiconductor layer.

In yet another embodiment of the present invention, the transistor structure further comprises an insulation layer. The insulation layer is formed between the first portion of the first patterned conductive layer and the patterned P-type organic polymer semiconductor layer.

As a result, the embodiment of the present invention provides a transistor structure using a transparent oxide semiconductor and organic polymer semiconductor as its material so as to solve the problem for using the a-Si:H TFT and Low Temperature Polycrystalline Silicon TFT (LTPS TFT) as its material. Specifically, the a-Si:H TFT and the LTPS TFT have the problem of low carrier mobility, high manufacturing cost, and high process temperature.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 1A and FIG. 1B shows schematically a diagram of a transistor structure according to one embodiment of the present invention.

FIG. 2A and FIG. 2B shows schematically a diagram of a transistor structure according to second embodiment of the present invention.

FIG. 5A and FIG. 5B shows schematically a diagram of a transistor structure according to fifth embodiment of the present invention.

DETAILED DESCRIPTION

Figure 3A:
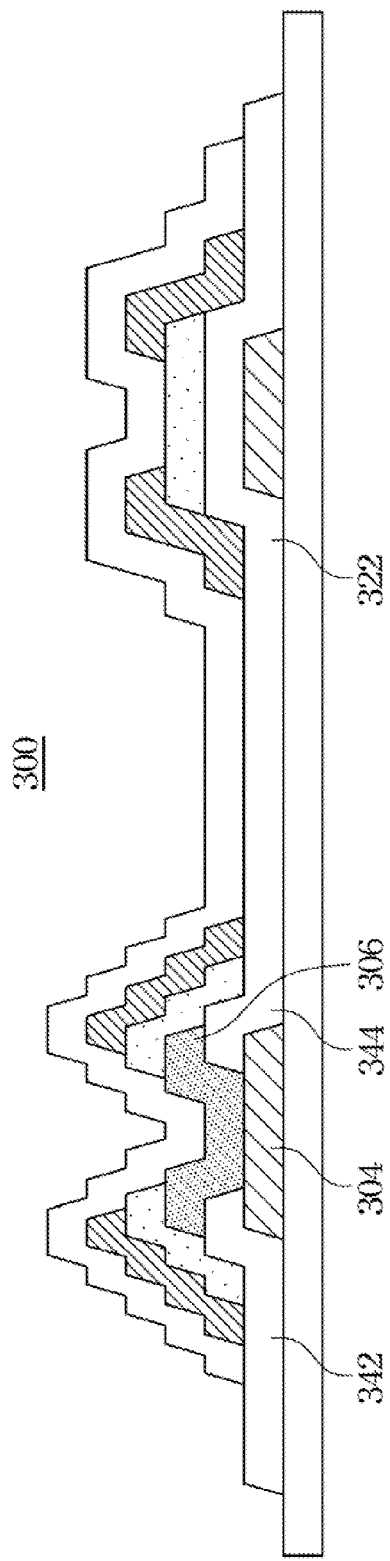
FIG. 3A and FIG. 3B shows schematically a diagram of a transistor structure according to third embodiment of the present invention.

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification, including examples of any terms discussed herein, is illustrative only, and in no way limits the scope and meaning of the disclosure or of any exemplified term. Likewise, the disclosure is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

FIG. 1A and FIG. 1B shows schematically a diagram of a transistor structure according to one embodiment of the present invention.

As shown in FIG. 1A, the transistor structure 100 comprises a first patterned conductive layer, a second patterned conductive layer, a third patterned conductive layer, a patterned N-type transparent oxide semiconductor layer (N-type transparent oxide semiconductor) 106, a patterned P-type organic polymer semiconductor layer (p-type organic polymer semiconductor), a patterned gate insulation layer 122, an active layer 124, and a covering insulation layer 132.

The first patterned conductive layer is formed over a substrate 102, and a first patterned conductive layer comprises a first portion 104 and a second portion 118, wherein the first portion 104 of the first patterned conductive layer is used as a base conductive layer (base electrode), and second portion 118 of the first patterned conductive layer is used as a gate. The patterned N-type transparent oxide semiconductor layer 106 is formed on the first portion 104 of the first patterned conductive layer. The patterned P-type organic polymer semiconductor layer is formed on the patterned N-type transparent oxide semiconductor layer 106, and the patterned P-type organic polymer semiconductor layer comprises a first portion 108 and a second portion 112, so that the patterned N-type transparent oxide semiconductor layer 106 and the first portion 108 and the second portion 112 of the patterned P-type organic polymer semiconductor layer form a heterojunction therebetween respectively, wherein the first portion 108 of the patterned P-type organic polymer semiconductor layer is used as an emitter, and the second portion 112 of the patterned P-type organic polymer semiconductor layer is used as a collector.

In addition, the third patterned conductive layer is formed on the patterned P-type organic polymer semiconductor layer, and the third patterned conductive layer comprises a first portion 114 and a second portion 116, so that the first portion 114 and the second portion 116 of the third patterned conductive layer are disposed on the first portion 108 and the second portion 112 of the patterned P-type organic polymer semiconductor layer respectively, wherein the first portion 114 of the third patterned conductive layer is used as an emitter conductive layer (emitter electrode), and the second portion 116 of the third patterned conductive layer is used as a collector conductive layer (collector electrode).

Moreover, the patterned gate insulation layer 122 is formed on the second portion 118 of the first patterned conductive layer. The active layer 124 is formed on the patterned gate insulation layer 122, so that the active layer 124 is disposed over the second portion 118 of the first patterned conductive layer, wherein the active layer 124 can be the patterned P-type organic polymer semiconductor layer. The second patterned conductive layer is formed on the active layer 124, and the second patterned conductive layer comprises a first portion 126 and a second portion 128, wherein the first portion 126 of the second patterned conductive layer is used as a source, and the second portion 128 of the second patterned conductive layer is used as a drain. The covering insulation layer 132 is formed on the second patterned conductive layer and the third patterned conductive layer, and the covering insulation layer 132 is formed on the substrate 102 and the patterned gate insulation layer 122 partially.

As a result, in the transistor structure as mentioned in FIG. 1A, the left structure of the transistor structure is a PNP Bipolar Junction transistor (BJT), and the right structure of the transistor structure is a Thin Film Transistor (TFT). Furthermore, as mentioned above, the BJT structure and the TFT structure have same manufacturing process in part so that the BJT structure and the TFT structure can be formed on a panel respectively or can be formed on a panel at the same time.

As shown in FIG. 1B, the transistor structure 150 is substantially the same as the transistor structure 100 mentioned in FIG. 1A except that the active layer 174 is the patterned N-type transparent oxide semiconductor layer.

In this embodiment, the patterned N-type transparent oxide semiconductor layer comprises InGaZnO (IGZO), and the patterned P-type organic polymer semiconductor layer comprises Pentacene. In addition, the first, the second and the third patterned conductive layer can be metal (for example, Ti, Au, Al, Mo, or ITO) or a conductive polymer (for example, Doped Polyaniline (PANI) or PEDOT: PSS (Baytron P). Moreover, the foregoing substrate can be a glass or a plastic substrate.

FIG. 2A and FIG. 2B shows schematically a diagram of a transistor structure according to the second embodiment of the present invention. As shown in FIG. 2A, the transistor structure 200 comprises a first patterned conductive layer, a second patterned conductive layer, a third patterned conductive layer, a patterned P-type organic polymer semiconductor layer 206, a patterned N-type transparent oxide semiconductor layer, a patterned gate insulation layer 222, an active layer 224, and a covering insulation layer 232.

The first patterned conductive layer is formed over a substrate 202, and the first patterned conductive layer comprises a first portion 204 and a second portion 218, wherein the first portion 204 of the first patterned conductive layer is used as a base conductive layer (base electrode), the second portion 218 of the first patterned conductive layer is used as a gate. The patterned P-type organic polymer semiconductor layer 206 is formed on the first portion 204 of the first patterned conductive layer. The patterned N-type transparent oxide semiconductor layer is formed on the patterned P-type organic polymer semiconductor layer 206, and the patterned N-type transparent oxide semiconductor layer comprises a first portion 208 and a second portion 212, so that patterned P-type organic polymer semiconductor layer and the first portion 208 and the second portion 212 of the patterned N-type transparent oxide semiconductor layer form a heterojunction therebetween respectively, wherein the first portion 208 of the patterned N-type transparent oxide semiconductor layer is used as an emitter, and the second portion 212 of the patterned N-type transparent oxide semiconductor layer is used as a collector.

Moreover, the third patterned conductive layer is formed on the patterned N-type transparent oxide semiconductor layer, and the third patterned conductive layer comprises a first portion 214 and a second portion 216, so that the first portion 214 and the second portion 216 of the third patterned conductive layer are disposed on the first portion 208 and the second portion 212 of the patterned N-type transparent oxide semiconductor layer respectively, wherein the first portion 214 of the third patterned conductive layer is used as an emitter conductive layer (emitter electrode), and the second portion 216 of the third patterned conductive layer is used as a collector conductive layer (collector electrode).

Furthermore, the patterned gate insulation layer 222 is formed on the second portion 218 of the first patterned conductive layer. The active layer 224 is formed on the patterned gate insulation layer 222, so that the active layer 224 is disposed over the second portion 218 of the first patterned conductive layer, wherein the active layer 224 can be the patterned N-type transparent oxide semiconductor layer. The second patterned conductive layer is formed on the active layer 224, and the second patterned conductive layer comprises a first portion 226 and a second portion 228, wherein the first portion 226 of the second patterned conductive layer is used as a source, and the second portion 228 of the second patterned conductive layer is used as a drain. The covering insulation layer 232 is formed on the second patterned conductive layer and the third patterned conductive layer, and the covering insulation layer 232 is formed on the substrate 202 and the patterned gate insulation layer 222 partially.

As a result, in the transistor structure as mentioned in FIG. 2A, the left structure of the transistor structure is a PNP Bipolar Junction transistor (BJT), and the right structure of the transistor structure is a Thin Film Transistor (TFT). Furthermore, as mentioned above, the BJT structure and the TFT structure have same manufacturing process in part so that the BJT structure and the TFT structure can be formed on a panel respectively or can be formed on a panel at the same time.

As shown in FIG. 2B, the transistor structure 250 is substantially the same as the transistor structure 200 mentioned in FIG. 2A except that the active layer 274 is the patterned P-type organic polymer semiconductor layer.

In this embodiment, the patterned N-type transparent oxide semiconductor layer comprises IGZO, and the patterned P-type organic polymer semiconductor layer comprises Pentacene. Moreover, the first, the second and the third patterned conductive layer can be metal (for example, Ti, Au, Al, Mo, or ITO) or a conductive polymer (for example, Doped Polyaniline (PANI) or PEDOT PSS (Baytron P). Moreover, the foregoing substrate can be the glass or plastic substrate.

Figure 3B:
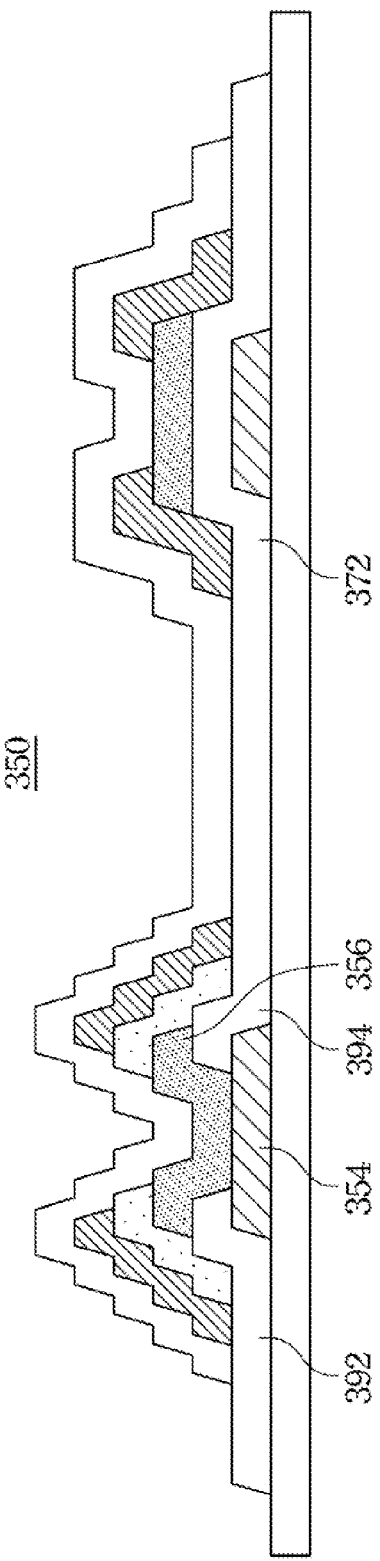

FIG. 3A and FIG. 3B shows schematically a diagram of a transistor structure according to the third embodiment of the present invention. As shown in FIG. 3A, comparing with the transistor structure 100 as shown in FIG. 1A, the transistor structure 300 further comprises an insulation layer. The insulation layer is formed between the first portion 304 of the first patterned conductive layer and the patterned N-type transparent oxide semiconductor layer 306, and the insulation layer comprises a first portion 342 and a second portion 344, wherein the first portion 342 of the insulation layer is formed on one side of the first portion 304 of the first patterned conductive layer and the patterned N-type transparent oxide semiconductor layer 306. The second portion 344 of the insulation layer is formed on the other side of the first portion 304 of the first patterned conductive layer and the patterned N-type transparent oxide semiconductor layer 306. The insulation layer and the patterned gate insulation layer 322 can be made in the same manufacturing process. In this embodiment, the transistor structure 300 is substantially the same as the transistor structure 100 mentioned in FIG. 1A except that the transistor structure 300 further comprises the insulation layer.

In addition, as shown in FIG. 3B, comparing with the transistor structure 150 mentioned in FIG. 1B, the transistor structure 350 further comprises an insulation layer. The insulation layer is formed between the first portion 354 of the first patterned conductive layer and the patterned N-type transparent oxide semiconductor layer 356, and the insulation layer comprises a first portion 392 and a second portion 394, wherein the first portion 392 of the insulation layer is formed on one side of the first portion 354 of the first patterned conductive layer and the patterned N-type transparent oxide semiconductor layer 356. The second portion 394 of the insulation layer is formed on the other side of the first portion 354 of the first patterned conductive layer and the patterned N-type transparent oxide semiconductor layer 356. The insulation layer and the patterned gate insulation layer 372 can be made in the same manufacturing process. In this embodiment, the transistor structure 350 is substantially the same as the transistor structure 150 mentioned in FIG. 1B except that the transistor structure 350 further comprises the insulation layer.

Figure 4A:
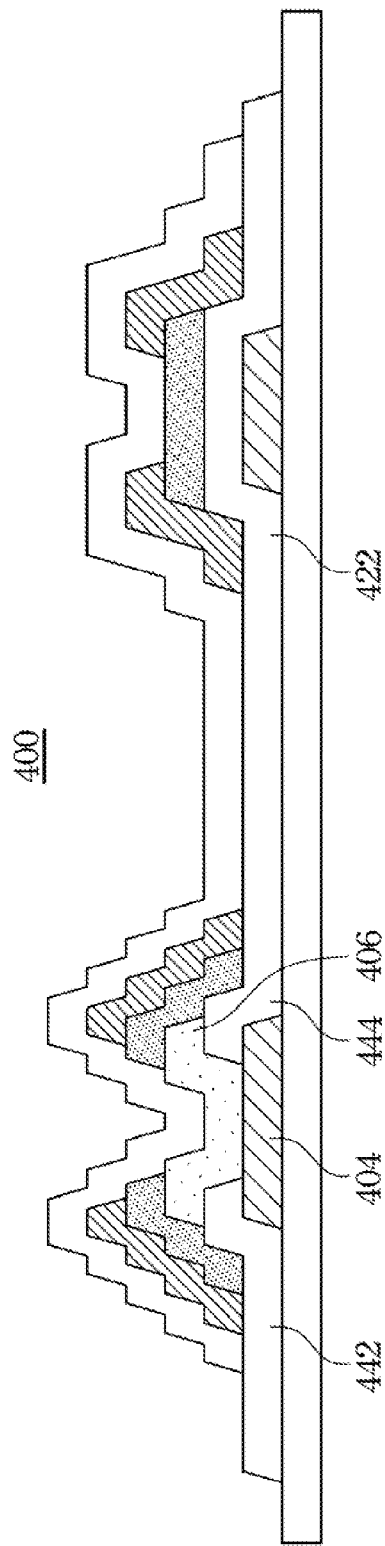
FIG. 4A and FIG. 4B shows schematically a diagram of a transistor structure according to forth embodiment of the present invention.
Figure 4B:
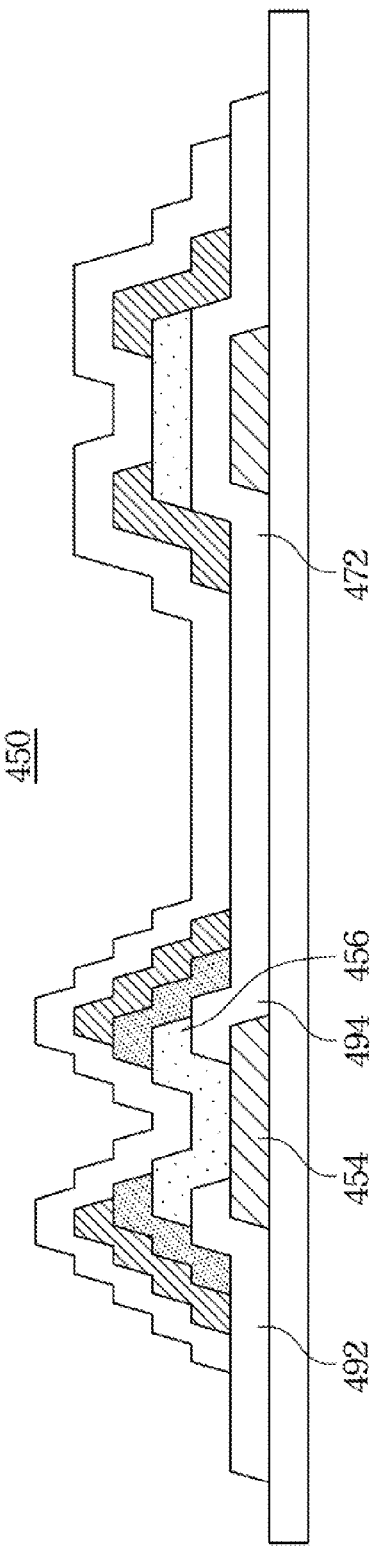

FIG. 4A and FIG. 4B shows schematically a diagram of a transistor structure according to the forth embodiment of the present invention. As shown in FIG. 4A, comparing with the transistor structure 200 as shown in FIG. 2A, the transistor structure 400 further comprises an insulation layer. The insulation layer is formed between the first portion 404 of the first patterned conductive layer and the patterned P-type organic polymer semiconductor layer 406, and the insulation layer comprises a first portion 442 and a second portion 444, wherein the first portion 442 of the insulation layer is formed on one side of the first portion 404 of the first patterned conductive layer and the patterned P-type organic polymer semiconductor layer 406. The second portion 444 of the insulation layer is formed on the other side of the first portion 404 of the first patterned conductive layer and the patterned P-type organic polymer semiconductor layer 406. The insulation layer and the patterned gate insulation layer 422 can be made in the same manufacturing process. In this embodiment, the transistor structure 400 is substantially the same as the transistor structure 200 mentioned in FIG. 2A except that the transistor structure 400 further comprises the insulation layer.

Moreover, as shown in FIG. 4B, comparing with the transistor structure 250 mentioned in FIG. 2B, the transistor structure 450 further comprises an insulation layer. The insulation layer is formed between the first portion 454 of the first patterned conductive layer and the patterned P-type organic polymer semiconductor layer 456, and the insulation layer comprises a first portion 492 and a second portion 494, wherein the first portion 492 of the insulation layer is formed on one side of the first portion 454 of the first patterned conductive layer and the patterned P-type organic polymer semiconductor layer 456. The second portion 494 of the insulation layer is formed on the other side of the first portion 454 of the first patterned conductive layer and the patterned P-type organic polymer semiconductor layer 456. The insulation layer and the patterned gate insulation layer 472 can be made in the same manufacturing process. In this embodiment, the transistor structure 450 is substantially the same as the transistor structure 250 mentioned in FIG. 2B except that the transistor structure 450 further comprises the insulation layer.

FIG. 5A and FIG. 5B shows schematically a diagram of a transistor to structure according to the fifth embodiment of the present invention. As shown in FIG. 5A, a transistor structure 500 comprises a first patterned conductive layer, a second patterned conductive layer, a third patterned conductive layer, a first patterned P-type organic polymer semiconductor layer 506, a first patterned. N-type transparent oxide semiconductor layer, a second patterned N-type transparent oxide semiconductor layer 522, a second patterned P-type organic polymer semiconductor layer and a covering insulation layer 534.

The first patterned conductive layer is formed over a substrate 502, and the first patterned conductive layer comprises a first portion 504 and a second portion 518, wherein the first portion 504 of the first patterned conductive layer is used as a first base conductive layer (first base electrode), the second portion 518 of the first patterned conductive layer is used as a second base conductive layer (second base electrode). The first patterned P-type organic polymer semiconductor layer 506 is formed on the first portion 504 of the first patterned conductive layer, which is used as a first base. The first patterned N-type transparent oxide semiconductor layer is formed on the first patterned P-type organic polymer semiconductor layer 506, and the first patterned N-type transparent oxide semiconductor layer comprises a first portion 508 and a second portion 512, so that the first patterned P-type organic polymer semiconductor layer 506 and the first portion 508 and the second portion 512 of the first patterned N-type transparent oxide semiconductor layer form a heterojunction therebetween respectively, wherein the first portion 508 of the first patterned N-type transparent oxide semiconductor layer is used as an emitter, and the second portion 512 of the first patterned N-type transparent oxide semiconductor layer is used as a collector.

In addition, the second patterned conductive layer is formed on the first patterned N-type transparent oxide semiconductor layer, and the second patterned conductive layer comprises a first portion 514 and a second portion 516, so that the first portion 514 and the second portion 516 of the second patterned conductive layer are disposed on the first portion 508 and the second portion 512 of the patterned N-type transparent oxide semiconductor layer respectively, wherein the first portion 514 of the second patterned conductive layer is used as a first emitter conductive layer (first emitter electrode), and the second portion 516 of the second patterned conductive layer is used as a collector conductive layer (first collector electrode).

Furthermore, the second patterned N-type transparent oxide semiconductor layer 522 is formed on the second portion 518 of the first patterned conductive layer, which is used as a second base. The second patterned P-type organic polymer semiconductor layer is formed on second patterned N-type transparent oxide semiconductor layer 522, and the second patterned P-type organic polymer semiconductor layer comprises a first portion 524 and a second portion 526, so that second patterned N-type transparent oxide semiconductor layer 522 and the first portion 524 and the second portion 526 of the second patterned P-type organic polymer semiconductor layer form a heterojunction therebetween respectively, wherein the first portion 524 of the second patterned P-type organic polymer semiconductor layer is used as an emitter, and the second portion 526 of the second patterned P-type organic polymer semiconductor layer is used as a collector.

The third patterned conductive layer is formed on the second patterned P-type organic polymer semiconductor layer, and the third patterned conductive layer comprises a first portion 528 and a second portion 532, so that the first portion 528 and the second portion 532 of the third patterned conductive layer is disposed on the first portion 524 and the second portion 526 of the second patterned P-type organic polymer semiconductor layer, wherein the first portion 528 of the third patterned conductive layer is used as a second emitter conductive layer (second emitter electrode), and the second portion 532 of the third patterned conductive layer is used as a second collector conductive layer (second collector electrode).

In this embodiment, the covering insulation layer 534 is formed on the second patterned conductive layer and the third patterned conductive layer, and the covering insulation layer 534 is formed on substrate 502 partially. Moreover, the first and the second patterned N-type transparent oxide semiconductor layer comprise IGZO, and the first and the second patterned P-type organic polymer semiconductor layer comprise Pentacene. Furthermore, the first, the second, and the third patterned conductive layer can be metal (for example, Ti, Au, Al, Mo, or ITO) or a conductive polymer (for example, Doped Polyaniline (PANI) or PEDOT PSS (Baytron P). Moreover, the foregoing substrate can be the glass or plastic substrate.

As a result, in the transistor structure as mentioned in FIG. 5A, the left structure of the transistor structure is a NPN Bipolar Junction transistor (BJT), and the right structure of the transistor structure is a PNP Bipolar Junction transistor (BJT). Furthermore, as mentioned above, these two types BJT structure have same manufacturing process in part so that these two types BJT structure can be formed on a panel respectively or can be formed on a panel at the same time.

As shown in FIG. 5B, comparing with the transistor structure 500 mentioned in FIG. 5A, the transistor structure 550 further comprises an insulation layer. The insulation layer is formed between the first portion 554 of the first patterned conductive layer and the first patterned P-type organic polymer semiconductor layer 556, and the insulation layer is formed between the second portion of the first patterned conductive layer and the second patterned N-type transparent oxide semiconductor layer 572. The insulation layer comprises a first portion 592, a second portion 594, and a third portion 596.

In practical, the second portion 594 of the insulation layer is formed between the first portion 554 of the first patterned conductive layer and the second portion 568 of the first patterned conductive layer, and the second in portion 594 of the insulation layer is formed between the first patterned P-type organic polymer semiconductor layer 556 and the second patterned N-type transparent oxide semiconductor layer 572. The first portion 592 of the insulation layer is formed on the other side of the first portion 554 of the first patterned conductive layer and the first patterned P-type organic polymer semiconductor layer 556. The third portion 596 of the insulation layer is formed on the other side of the second portion 568 of the first patterned conductive layer and the second patterned N-type transparent oxide semiconductor layer 572.

In this embodiment, the transistor structure 550 is substantially the same as the transistor structure 500 mentioned in FIG. 5A except that the transistor structure 550 further comprises the insulation layer.

Specifically, the N-type transparent oxide semiconductor according to one embodiment of the present invention is flexible and transparent and has low temperature deposition, great uniformity, and so on. The active layer of the TFT is formed with IGZO, so that the carrier mobility of the active layer of the IGZO TFT is higher than the carrier mobility of the traditional a-Si:H TFT, the uniformity of the IGZO TFT is greater than the uniformity of the LTPS TFT, and the IGZO TFT can be made in low temperature. The replacing of the a-Si:H TFT and the LTPS TFT by the IGZO TFT for manufacturing the active matrix organic light emitting display can improve many problems (for example, the carrier mobility is low and the process temperature is high when the active layer of the TFT is formed with a-Si:H, and the manufacturing cost is high and the process temperature is high when the active layer of the TFT is formed with LTPS).

Moreover, the P-type organic polymer semiconductor mentioned in the embodiment of the invention is flexible electronics, and the flexible electronics possess the property of light, thin, large area, and flexible. The flexible electronics have been widely used in many applications that is different from the silicon chip and the glass substrate. In addition, for satisfying the property of the flexible electronics, the whole manufacturing process must be implemented in a low temperature to form the microelectronic device on the flexible plastic substrate. Thus, the N-type transparent oxide semiconductor can be manufactured in a low temperature, so that the N-type transparent oxide semiconductor can cooperate with the P-type organic polymer semiconductor for achieving more extensive application. For example, the transistor structure formed with the two mentioned semiconductor material is conducive to make the System on Panel (SOP); that is to say, the whole periphery circuit (for example, critical components, memory components, and a driver circuit) can be integrated on the glass or plastic substrate.

According to the above embodiments of the present invention, the application of the present invention has the following advantages. In the embodiments of the present invention, the transistor structure is formed with the transparent oxide semiconductor and the organic polymer semiconductor for solving the problem caused by forming the transistor structure with the a-Si:H and the LTPS. Comparing with using the transparent oxide semiconductor and the organic polymer semiconductor as the material of the transistor structure, the transistor structure formed with the a-Si:H and the LTPS has many disadvantages such as low carrier mobility, high manufacturing cost, and high process temperature.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention, and the scope thereof is determined by the claims that follow.

What is claimed is:

1. A transistor structure, comprising:
    a patterned N-type transparent oxide semiconductor layer formed over a substrate as a base; and
    a patterned P-type organic polymer semiconductor layer formed on the patterned N-type transparent oxide semiconductor layer, wherein the patterned P-type organic polymer semiconductor layer comprises a first portion and a second portion so that the patterned N-type transparent oxide semiconductor layer and the first portion and the second portion of the patterned P-type organic polymer semiconductor layer form heterojunctions therebetween respectively, wherein the first portion of the patterned P-type organic polymer semiconductor layer is used as an emitter, and the second portion of the patterned P-type organic polymer semiconductor layer is used as a collector.

2. The transistor structure according to claim 1, wherein the patterned N-type transparent oxide semiconductor layer comprises IGZO, and the patterned P-type organic polymer semiconductor layer comprises Pentacene.

3. The transistor structure according to claim 1, further comprising an insulation layer formed between the substrate and the patterned N-type transparent oxide semiconductor layer.

4. A transistor structure, comprising
    a patterned P-type organic polymer semiconductor layer formed over a substrate as a base; and
    a patterned N-type transparent oxide semiconductor layer formed on the patterned P-type organic polymer semiconductor layer, wherein the patterned N-type transparent oxide semiconductor layer comprises a first portion and a icy second portion so that the patterned P-type organic polymer semiconductor layer and the first portion and the second portion of the patterned N-type transparent oxide semiconductor layer form heterojunctions therebetween respectively, wherein the first portion of the patterned N-type transparent oxide semiconductor layer is used as an emitter, and the second portion of the patterned N-type transparent oxide semiconductor layer is used as a collector.

5. The transistor structure according to claim 4, wherein the patterned N-type transparent oxide semiconductor layer comprises IGZO, and the patterned. P-type organic polymer semiconductor layer comprises Pentacene.

6. The transistor structure according to claim 4, further comprising
    an insulation layer formed between the substrate and the patterned P-type organic polymer semiconductor layer.

7. A transistor structure, comprising:
    a first patterned conductive layer formed over a substrate, wherein the first patterned conductive layer comprises a first portion and a second portion, the first portion of the first patterned conductive layer is used as a base conductive layer, and the second portion of the first patterned conductive layer is used as a gate;
    a patterned N-type transparent oxide semiconductor layer formed on the first portion of the first patterned conductive layer;
    a patterned P-type organic polymer semiconductor layer formed on the patterned N-type transparent oxide semiconductor layer, wherein the patterned P-type organic polymer semiconductor layer comprises a first portion and a second portion so that the patterned N-type transparent oxide semiconductor layer and the first portion and the second portion of the patterned P-type organic polymer semiconductor layer form heterojunctions therebetween respectively, wherein the first portion of the patterned P-type organic polymer semiconductor layer is used as an emitter, and the second portion of the patterned P-type organic polymer semiconductor layer is used as a collector;
    a patterned gate insulation layer formed on the second portion of the first patterned conductive layer;
    an active layer formed on the patterned gate insulation layer so that the active layer is disposed over the second portion of the first patterned conductive layer; and
    a second patterned conductive layer formed on the active layer, wherein the second patterned conductive layer comprises a first portion and a second portion, wherein the first portion of the second patterned conductive layer is used as a source, and the second portion of the second patterned conductive layer is used as a drain.

8. The transistor structure according to claim 7, wherein the patterned N-type transparent oxide semiconductor layer comprises IGZO, and the patterned P-type organic polymer semiconductor layer comprises Pentacene.

9. The transistor structure according to claim 7, wherein the active layer is the patterned N-type transparent oxide semiconductor layer or the patterned P-type organic polymer semiconductor layer.

10. The transistor structure according to claim 7, further comprising
    an insulation layer formed between the first portion of the first patterned conductive layer and the patterned N-type transparent oxide semiconductor layer.

11. A transistor structure, comprising
    a first patterned conductive layer formed over a substrate, wherein the first patterned conductive layer comprises a first portion and a second portion, wherein the first portion of the first patterned conductive layer is used as a base conductive layer, the second portion of the first patterned conductive layer is used as a gate;

a patterned P-type organic polymer semiconductor layer formed on the first portion of the first patterned conductive layer;

a patterned N-type transparent oxide semiconductor layer formed on the patterned P-type organic polymer semiconductor layer, wherein the patterned N-type transparent oxide semiconductor layer comprises a first portion and a second portion so that the patterned P-type organic polymer semiconductor layer and the first portion and the second portion of the patterned N-type transparent oxide semiconductor layer form heterojunctions therebetween respectively, wherein the first portion of the patterned N-type transparent oxide semiconductor layer is used as an emitter, and the second portion of the patterned N-type transparent oxide semiconductor layer is used as a collector;

a patterned gate insulation layer formed on the second portion of the first patterned conductive layer;

an active layer formed on the patterned gate insulation layer so that the active layer is disposed over the second portion of the first patterned conductive layer; and a second patterned conductive layer formed on the active layer, wherein the second patterned conductive layer comprises a first portion and a second portion, wherein the first portion of the second patterned conductive layer is used as a source, and the second portion of the second patterned conductive layer is used as a drain.

12. The transistor structure according to claim 11, wherein the patterned N-type transparent oxide semiconductor layer comprises IGZO, and the patterned P-type organic polymer semiconductor layer comprises Pentacene.

13. The transistor structure according to claim 11, wherein the active layer is the patterned N-type transparent oxide semiconductor layer or the patterned P-type organic polymer semiconductor layer.

14. The transistor structure according to claim 11, further comprising an insulation layer formed between the first portion of the first patterned conductive layer and the patterned P-type organic polymer semiconductor layer.

* * * * *